United States Patent [19]

Sasai

[11] Patent Number: 5,197,134
[45] Date of Patent: Mar. 23, 1993

[54] PIPELINE PROCESSOR FOR PERFORMING WRITE INSTRUCTION BY REFERRING TO CACHE MEMORY SEARCH RESULT OBTAINED DURING IDLING STATE OF OPERAND READING CYCLE

[75] Inventor: Kiyotaka Sasai, Tokyo, Japan

[73] Assignee: Kabushiki Kaisha Toshiba, Kawasaki, Japan

[21] Appl. No.: 525,774

[22] Filed: May 21, 1990

[30] Foreign Application Priority Data

May 19, 1989 [JP] Japan .................................. 1-124533

[51] Int. Cl.⁵ .......................... G06F 9/30; G06F 9/38
[52] U.S. Cl. ............................ 395/375; 364/948.34; 364/946.2; 364/231.8; 364/259.2; 364/DIG. 1; 395/800; 395/425
[58] Field of Search ................... 364/736, 736.5; 395/375, 425, 550, 800

[56] References Cited

U.S. PATENT DOCUMENTS

| | | | |
|---|---|---|---|
| 4,594,682 | 6/1986 | Drimak | 364/736 |
| 4,858,111 | 8/1989 | Steps | 395/425 |
| 4,888,722 | 12/1989 | Boreland | 364/736.5 |
| 4,958,274 | 9/1990 | Dutton et al. | 395/550 |
| 5,021,993 | 6/1991 | Natoba et al. | 395/775 |

FOREIGN PATENT DOCUMENTS

WO 87/04823 8/1987 PCT Int'l Appl. .
2200483 8/1988 United Kingdom .

Primary Examiner—Lawrence E. Anderson
Assistant Examiner—Meng-Ai T. An
Attorney, Agent, or Firm—Foley & Lardner

[57] ABSTRACT

A pipeline processor adapted for a microprocessor executes pipeline processes. The pipeline processes comprise the steps of reading a machine language instruction; decoding the read instruction; generating an address according to the decoded instruction; reading operand data from a cache memory according to the generated address; executing the instruction; and writing data into the cache memory. When the machine language instruction is a write instruction, the operand data reading step involves a process of searching the cache memory for the address where data is to be written. A result of the search is held in flag memories. Thereafter, the data writing step involves a process of referring to the flag memories, and is completed in one machine cycle.

2 Claims, 6 Drawing Sheets

FIG.2
PRIOR ART

| IF | A | B | C | D |   |   |   |   |   |   |   |   |   |
|----|---|---|---|---|---|---|---|---|---|---|---|---|---|
| DC |   | A | B | C | D |   |   |   |   |   |   |   |   |
| AG |   |   | A | B | C | D |   |   |   |   |   |   |   |
| OF |   |   |   | A |   |   | D |   |   |   |   |   |   |
| EX |   |   |   |   | A | B | C |   | D |   |   |   |   |
| OS |   |   |   |   |   |   | B | B | C | C |   |   |   |

FIG.6

| | | | | | | | | | | | | | |
|----|----|----|----|----|----|----|----|----|----|----|----|----|----|
| IF | A | B | C | D | E | | | | | | | | |
| DC | | A | B | C | D | E | | | | | | | |
| AG | | | A | B | C | D | E1 | E2 | | | | | |
| OF | | | | A | B | C | D | E1 | E2 | | | | |
| EX | | | | | A | B | C | D | E1 | E2 | | | |
| OS | | | | | | B | C | | | E2 | | | |

PIPELINE PROCESSOR FOR PERFORMING WRITE INSTRUCTION BY REFERRING TO CACHE MEMORY SEARCH RESULT OBTAINED DURING IDLING STATE OF OPERAND READING CYCLE

BACKGROUND OF THE INVENTION

1. Field of the Invention

The present invention relates to a microprocessor having a cache memory, and particularly to a pipeline processor and pipeline processing method for the microprocessor.

2. Description of the Prior Art

FIG. 1 is a block diagram showing a conventional pipeline processor. An instruction reading part 1 reads a machine language instruction. A decoding part 3 decodes the instruction. An address generating part 5 provides an operand address. Based on the operand data, an executing part 9 executes the instruction. A writing part 11 writes a result of the execution.

The data reading and writing processes mentioned above are carried out with respect to a cache memory 13. When data are read out of the cache memory 13, an address tag area of the cache memory 13 is simultaneously searched for an address tag of the read data to judge the validity of the read data. This reading operation needs, therefore, only one machine cycle.

When data are written into the cache memory 13, there is a risk of writing the data into an incorrect location of the cache memory 13 if the data writing operation and address tag searching operation are simultaneously carried out and if a cache miss is judged by the address tag searching operation. To avoid the risk, the address tag searching operation must be done first, and then the data writing operation. The data writing process requires, therefore, two machine cycles.

FIG. 2 shows a flow of pipeline processes carried out in the conventional pipeline processor of FIG. 1. Respective processing stages are vertically arranged in FIG. 2 with the same reference marks seen in FIG. 1. In FIG. 2, time elapses from the left to the right, and an interval between adjacent dotted lines corresponds to one machine cycle.

In FIG. 2, a read instruction A, write instructions B and C, and a read instruction D are pipeline-processed in parallel. The fifth and sixth machine cycles of an operand reading stage OF carried out in the operand reading part 7 are blank, because the write instructions B and C do not involve an operand reading operation. Each of the write instructions B and C requires, however, two machine cycles in a writing stage OS carried out in the writing part 11. The first one of the two machine cycles is used to search the cache memory 13 for an address tag of data to be written, and the second one is used to write the data into the cache memory 13.

In this way, the conventional pipeline processor involves a processing stage where blanks occur and a processing stage where two machine cycles are consumed. These are disadvantages in achieving an effective parallel processing.

SUMMARY OF THE INVENTION

An object of the present invention is to provide a pipeline processor and a pipeline processing method for a microprocessor, which enable a writing process of a write instruction to be completed in one machine cycle.

In order to accomplish the object, the present invention effectively uses an operand reading part of the pipeline processor that is conventionally not driven for the write instruction. After an address of the write instruction is calculated, the operand reading part checks to see whether or not the calculated address exists in a cache memory. A result of the checking is held in a flag memory such as a flip-flop. In a writing stage, the flag memory is checked to confirm a cache hit, and data is written immediately. This arrangement can reduce the number of machine cycles of the writing stage from two to one.

These and other objects, features and advantages of the present invention will be more apparent from the following detailed description of preferred embodiments in conjunction with the accompanying drawings.

BRIEF DESCRIPTION OF THE DRAWINGS

FIG. 2 is an explanatory view showing a flow of pipeline processes carried out in the pipeline processor of FIG. 1;

FIGS. 5 and 6 are explanatory views showing a flow of pipeline processes carried out in the pipeline processor of FIG. 3.

DETAILED DESCRIPTION OF THE EMBODIMENTS

Figure 1:
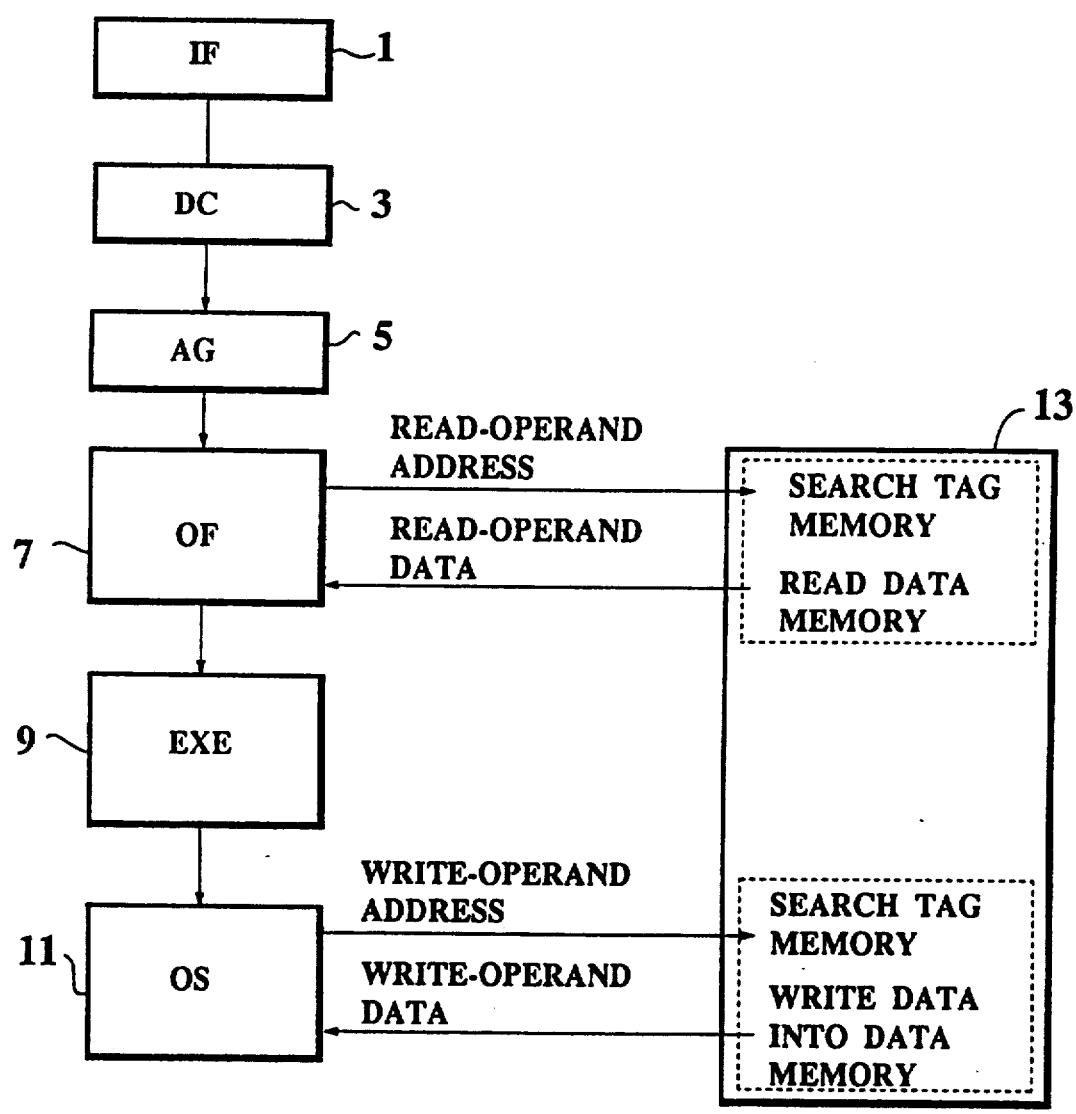
FIG. 1 is a block diagram showing a conventional pipeline processor.
Figure 3:
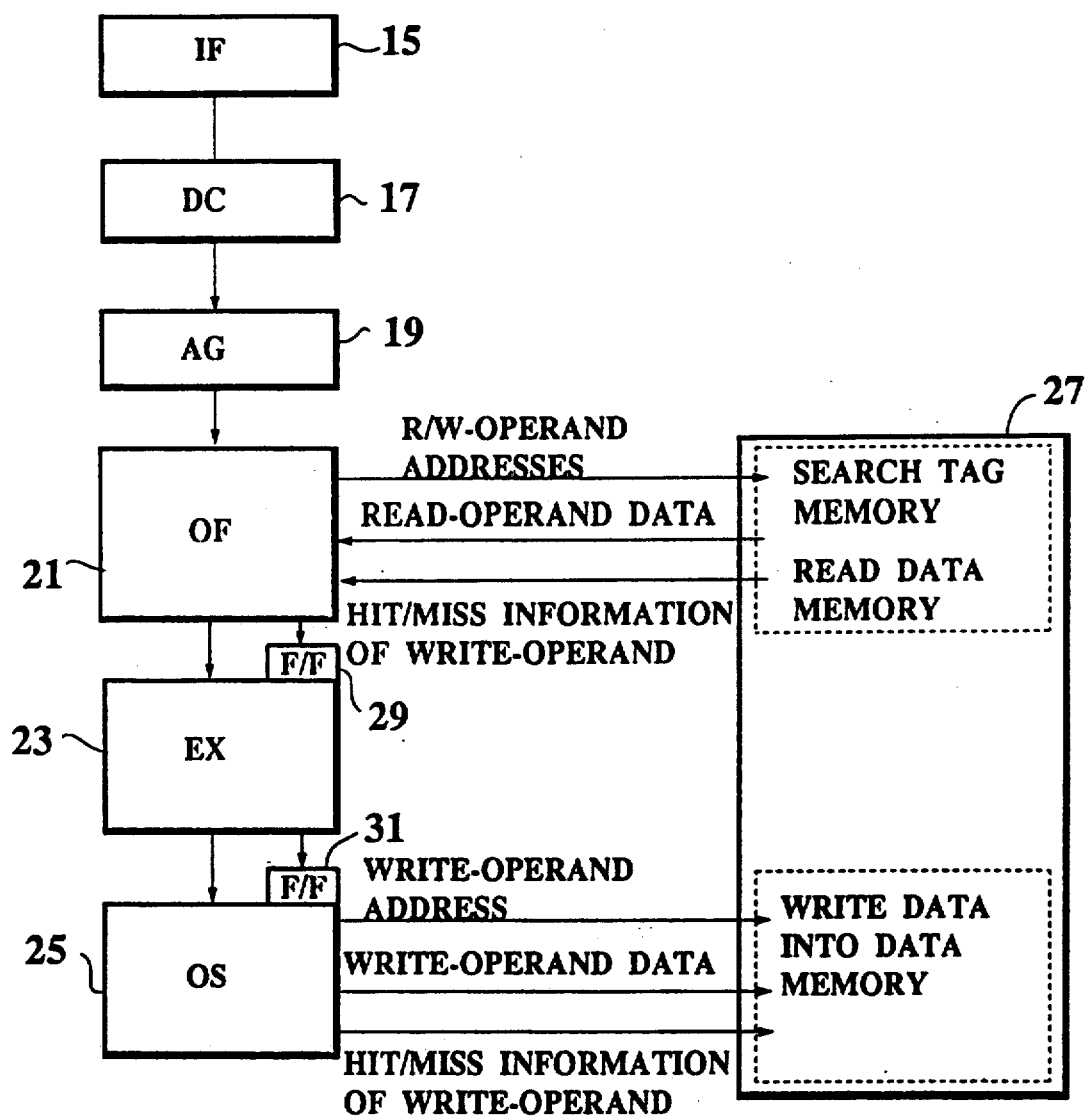
FIG. 3 is a block diagram showing a pipeline processor according to the present invention.

FIG. 3 is a block diagram showing a pipeline processor according to an embodiment of the present invention. The pipeline processor comprises an instruction reading part 15, an instruction decoding part 17, an address generating part 19, an operand reading part 21, an instruction executing part 23, and a writing part 25. The operand reading part 21 and writing part 25 are connected to a cache memory 27.

Figure 4:
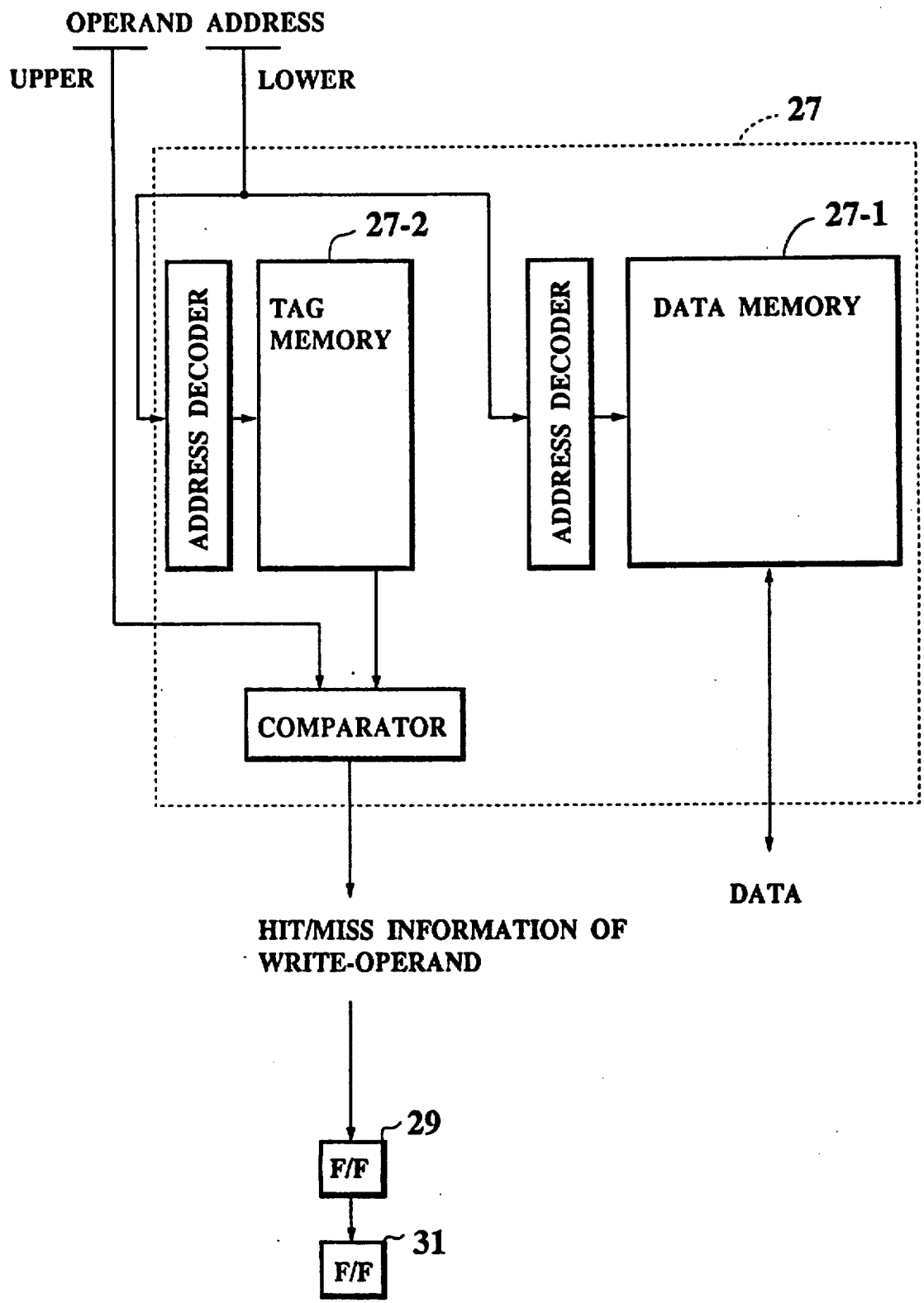
FIG. 4 is a block diagram showing a cache memory and a flow of a cache memory search signal, according to the present invention.

FIG. 4 shows the details of the cache memory 27. The cache memory comprises a data memory 27-1 and a tag memory 27-2 for storing address tags that indicate addresses of data blocks stored in the data memory 27-1.

According to the present invention, the operand reading part 21 is particularly important.

Figure 5:
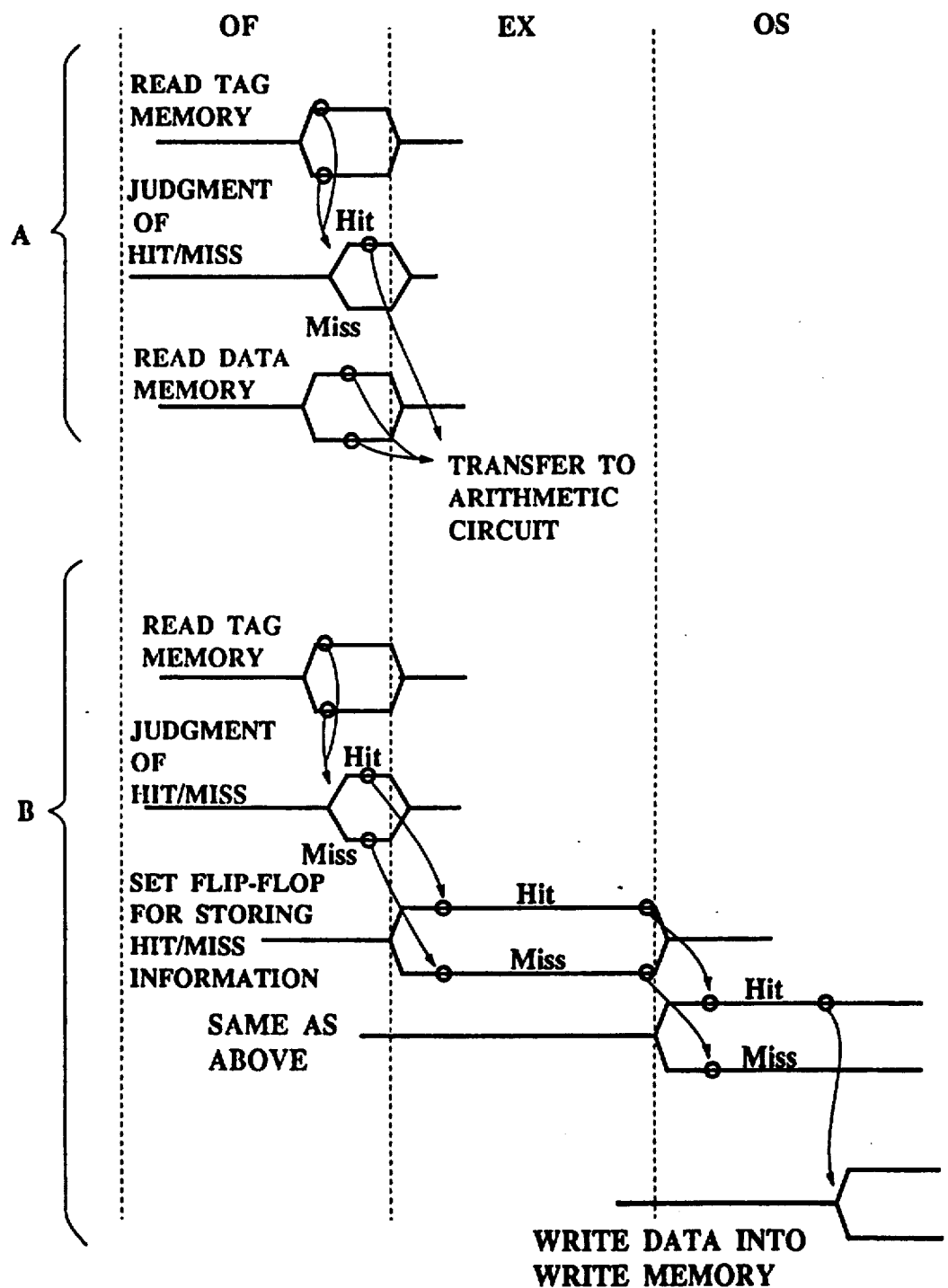

If an instruction to be processed is a read instruction, operand data of the instruction is read out of the cache memory 27, and at the same time, an address tag of the operand data is searched in the cache memory 27, similar to the conventional pipeline processes. If no cache miss is detected, i.e., if the address tag of the operand data is found in the tag memory 27-2 of the cache memory 27, the read operand data is transferred to the executing part 23 as shown in FIG. 5A.

If the instruction to be processed is a write instruction, operand data is not needed for executing the instruction. In this case, unlike the conventional pipeline processor whose operand reading part 7 carries out no operation for the write instruction and provides a blank machine cycle, the operand reading part 21 of the present invention utilizes the machine cycle to see whether or not an address where data is to be written exists in the cache memory 27, as shown in FIG. 5B. Namely, the operand reading part 21 compares the address where data is to be written with the address tags stored in the tag memory 27-2 of the cache memory 27, and provides a signal indicating a result of the comparison, i.e., a cache hit signal or a cache miss signal. The signal is stored in a flip-flop 29.

In the next machine cycle, the instruction is executed in the executing part 23, and the contents of the flip-flop 29 are transferred to a flip-flop 31 as shown in FIGS. 3 and 4. The writing part 25 refers to the comparison result held in the flip-flop 31, and immediately writes the data into the cache memory 27 if a cache hit is confirmed.

Effects of the present invention will be explained with reference to FIG. 6 which illustrates the flow of the pipeline processes from FIG. 2.

Unlike the conventional pipeline processor which carries out no process for a write instruction in the operand reading part 7, the operand reading part 21 of the present invention handles the write instruction such as the instructions B and C. Namely, the operand reading part 21 searches the tag memory 27-2 of the cache memory 27 for an address where data is to be written. This brings effects that the operand writing part 25 requires only one machine cycle for writing the data into the cache memory 27, that each of the pipeline stages is completed in one machine cycle, and that respective instructions are effectively aligned linearly as shown in FIG. 6.

According to the conventional pipeline processes of FIG. 2, execution of the instruction C is completed in the tenth cycle. According to the present invention, the same is completed in the eighth cycle as shown in FIG. 6. In connection with an instruction E involving reading and writing processes, two instruction, i.e., a read instruction E1 and a write instruction E2 are processed similar to the instructions A and B after the addresses thereof are calculated. For the write instruction E2, an address tag of the address is searched in the tag memory 27-2 of the cache memory 27 in the operand reading stage OF.

Various modifications will become possible for those skilled in the art after receiving the teachings of the present disclosure without departing from the scope thereof.

What is claimed is:

1. A pipeline processor comprising:
   an instruction fetching part for fetching a machine language instruction;
   a decoding part receiving the fetched instruction and outputting a decoded instruction, indicative of the type of instruction fetched;
   an address generating part receiving said decoded instruction and outputting an address;
   an operand accessing part for accessing operand data from a cache memory according to the address generated by said address generating part, said operand accessing part searching a tag storing area of the cache memory for the generated address where data is to be written, when the machine language instruction is a write instruction;
   a first flag memory for holding a result of the search;
   an executing part for executing the instruction;
   a second flag memory for holding the contents of said first flag memory; and
   a writing part for writing data into the cache memory after referring to the contents of said second flag memory.

2. A pipeline processing method comprising the steps of:
   fetching a machine language instruction;
   decoding the instruction obtained from having fetched the machine language instruction and outputting a decoded instruction which indicates what type of instruction was fetched;
   generating an address according to the decoded instruction obtained from having decoded the fetched instruction;
   fetching operand data from a cache memory according to the address generated in said address generating step;
   executing the instruction; and
   writing data into the cache memory when said machine language instruction is a write instruction, wherein,
   said operand data fetching step involves, when the machine language instruction is a write instruction, searching the cache memory for the address where data is to be written, storing a result of the search in a first flag memory that is prepared for some of said steps to be carried out after said operand data fetching step, thereafter copying the contents of said first flag memory to a second flag memory, and wherein
   said data writing step involves referring to the second flag memory, and is completed in one machine cycle.

* * * * *